United States Patent
Kim et al.

(10) Patent No.: US 8,418,355 B2
(45) Date of Patent: Apr. 16, 2013

(54) METHOD FOR MANUFACTURING CIRCUIT BOARD

(75) Inventors: Sang-Duck Kim, Suwon-si (KR); Jung-Hyun Park, Suwon-si (KR); Hoe-Ku Jung, Daejeon (KR); Jong-Gyu Choi, Seoul (KR); Ji-Eun Kim, Gwangmyeong-si (KR); Jeong-Woo Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1194 days.

(21) Appl. No.: 11/976,071

(22) Filed: Oct. 19, 2007

(65) Prior Publication Data

US 2008/0098596 A1    May 1, 2008

(30) Foreign Application Priority Data

Oct. 25, 2006  (KR) .................. 10-2006-0104205

(51) Int. Cl.
*H05K 3/20* (2006.01)

(52) U.S. Cl.
USPC .................. 29/831; 29/848; 29/851; 101/170

(58) Field of Classification Search .............. 29/830, 29/831, 846, 848, 849, 851, 852; 101/150, 101/153, 158, 163, 170, 491; 427/98.4; 438/780
See application file for complete search history.

(56) References Cited

U.S. PATENT DOCUMENTS

| 5,201,268 | A  | * | 4/1993  | Yamamoto et al. ........... 101/170 |
| 6,808,578 | B2 | * | 10/2004 | Hashimoto ................... 156/235 |
| 6,946,205 | B2 |   | 9/2005  | Higashitani |
| 7,140,296 | B2 | * | 11/2006 | Baek et al. .................... 101/170 |

FOREIGN PATENT DOCUMENTS

| CN | 1381160 A   |   | 11/2002 |
| JP | 63-6894     |   | 1/1988  |
| JP | 5-309963    |   | 11/1993 |
| JP | 2003-149833 | * | 5/2003  |
| JP | 2006-229115 |   | 8/2008  |
| TW | 1263119     |   | 8/2005  |
| TW | 1261486     |   | 9/2006  |

OTHER PUBLICATIONS

Japanese Office Action issued Feb. 16, 2010 in corresponding Japanese Patent Application 2007-276876.
Taiwanese Office Action issued Mar. 1, 2011 in corresponding Taiwanese Patent Application 096139550.

* cited by examiner

*Primary Examiner* — Donghai D. Nguyen

(57) ABSTRACT

A method for forming transcriptional circuits and a method for manufacturing a circuit board are disclosed. A method of forming a transcriptional circuit, which includes forming an intaglio pattern corresponding to a circuit pattern by selectively forming a resist on a mold board, filling conductive material in the intaglio pattern, and transferring the conductive material onto a carrier by pressing the carrier onto the mold board such that the carrier faces the surface of the mold board having the conductive material filled in, makes it possible to form transcriptional circuits that can be transcribed into an insulation board using existing equipment, whereby costs can be reduced.

7 Claims, 12 Drawing Sheets

METHOD FOR MANUFACTURING CIRCUIT BOARD

CROSS-REFERENCE TO RELATED APPLICATIONS

This application claims the benefit of Korean Patent Application No. 10-2006-0104205 filed with the Korean Intellectual Property Office on Oct. 25, 2006, the disclosure of which is incorporated herein by reference in its entirety.

BACKGROUND

1. Technical Field

The present invention relates to a method for forming transcriptional circuits and a method for manufacturing a circuit board.

2. Description of the Related Art

Developments in the electronics industry have promoted smaller and more functionalized electronic parts, including mobile phones, etc., and as a result, there is a growing demand for smaller and higher-density printed circuit boards. According to such trends towards lighter, thinner, and simpler electronic products, so also is the printed circuit board being endowed with finer patterns, smaller sizes, and packaged forms.

A technique currently in wide use for manufacturing fine circuit patterns is photolithography, which is a method of forming patterns on a board coated with a thin film of photoresist. However, the sizes of patterns thus formed are limited by the optical diffraction phenomenon, and the resolving power is almost proportional to the wavelengths of the rays used. Therefore, with greater degrees of integration of semiconductor components, an exposure technique is required that uses shorter wavelengths for forming fine patterns, but such a method is liable to cause non-uniformity in the critical dimensions of a photoresist pattern, so that the circuit pattern formed using the photoresist pattern as a mask may turn out to have a different form from that initially desired. There may also be a problem that impurities occurring during the processes can react with and erode the photoresist, so that the photoresist pattern may change.

Processes such as MSAP (modified semi-additive process), SAP (semi-additive process), etc., have been used as methods of implementing high densities for fine-line circuit patterns, in which circuits are selectively grown on a thin copper film. However, there are difficulties in applying these methods, due to the additional infrastructure required in terms of materials and investments for new equipment, and because damage may occur on the finished circuits during the procedures for removing portions of the thin copper film that are not used as circuits, so that the target circuit width is not obtained.

Furthermore, the circuit patterns formed according to such methods are exposed at the upper portion of the insulation board, so that the overall height of the board is great, and undercuts can occur at the attachment portions between the circuit patterns and the insulation board, causing the circuits to be peeled off from the insulation board.

SUMMARY

An aspect of the invention is to provide a method of readily forming a transcriptional circuit that can be transcribed onto an insulation board using existing equipment, by forming an intaglio pattern corresponding to the circuit pattern on a mold board, filling the intaglio pattern with conductive material, and transferring this to a carrier.

Another aspect of the invention is to provide a method of manufacturing a circuit board in which a circuit pattern can be formed to a high density, as a transcriptional circuit formed on a carrier is transcribed onto an insulation board such that the circuit pattern is buried in the insulation board.

One aspect of the invention provides a method of forming a transcriptional circuit, which includes forming an intaglio pattern corresponding to a circuit pattern by selectively forming a resist on a mold board, filling conductive material in the intaglio pattern, and transferring the conductive material onto a carrier by pressing the carrier onto the mold board such that the carrier faces the surface of the mold board having the conductive material filled in.

Forming the intaglio pattern can include stacking a photosensitive film layer on the mold board, and selectively exposing and developing the photosensitive film layer.

In certain embodiments, the method can further include an operation of forming a separation film in the intaglio pattern, before filling in the conductive material.

The mold board may be a metal plate, and filling in the conductive material can be performed by electroplating.

Transferring the conductive material can include forming an adhesion layer on one surface of the carrier, stacking and hot-pressing the carrier and the mold board such that the surface of the mold board having the conductive material filled in faces the surface of the carrier on which the adhesion layer is formed, and separating the mold board and the carrier. In this case, the adhesion layer can be a thermoplastic adhesive.

After transferring the conductive material, the operations of filling in the conductive material and transferring the conductive material can be performed repeatedly.

Another aspect of the invention provides a method of manufacturing a circuit board, which includes forming an intaglio pattern corresponding to a circuit pattern by selectively forming a resist on a mold board, filling conductive material in the intaglio pattern, transferring the conductive material onto a carrier by pressing the carrier onto the mold board such that the carrier faces the surface of the mold board having the conductive material filled in, and transcribing the conductive material into an insulation board by pressing the insulation board onto the carrier such that the insulation board faces the surface of the carrier to which the conductive material is transferred.

Before filling in the conductive material, an operation can be included of forming a separation film in the intaglio pattern.

The operation of transferring the conductive material can include forming an adhesion layer on one surface of the carrier, stacking and hot-pressing the carrier and the mold board such that the surface of the mold board having the conductive material filled in faces the surface of the carrier on which the adhesion layer is formed, and separating the mold board and the carrier.

Transcribing the conductive material can include stacking and hot-pressing the insulation board and the carrier such that the insulation board faces the surface of the carrier to which the conductive material is transferred, and separating the insulation board and the carrier.

The insulation board can include at least one of thermoplastic resin and glass epoxy resin, and the insulation board may be in a deformable state during the transcribing of the conductive material.

Additional aspects and advantages of the present invention will be set forth in part in the description which follows, and in part will be obvious from the description, or may be learned by practice of the invention.

DETAILED DESCRIPTION

Figure 1A:
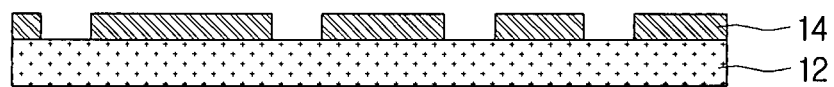
FIG. 1A, FIG. 1B, FIG. 1C, FIG. 1D, and FIG. 1E are cross-sectional views representing a flow diagram of a method of forming a transcriptional circuit according to an embodiment of the present invention.

The method for forming a transcriptional circuit and the method for manufacturing a circuit board according to certain embodiments of the invention will be described below in more detail with reference to the accompanying drawings, in which those components are rendered the same reference numeral that are the same or are in correspondence, regardless of the figure number, and redundant explanations are omitted.

FIGS. 1A to 1E are cross-sectional views representing a flow diagram of a method of forming a transcriptional circuit according to an embodiment of the present invention. In FIGS. 1A to 1E are illustrated a resist 12, a mold board 14, a carrier 15, a separation film 16, conductive material 18, an adhesion layer 17, and a transcriptional circuit 20.

With regards the present invention, a transcriptional circuit 20 refers to the conductive material 18 formed in relievo on the carrier 15, in correspondence to the circuit pattern 24 that is to be formed on the insulation board 22. The conductive material 18 formed in relievo on the carrier 15 can be transcribed and buried into the insulation board in a deformable state to form a circuit board.

The method of selectively forming the resist 12 on the mold board 14 to form an intaglio pattern can include, first, applying a photosensitive material on the mold board 14 using existing equipment, fabricating a photomask in correspondence to the circuit pattern 24 and stacking the photomask onto the mold board 14 to which the photosensitive material is applied, and then exposing to ultraviolet rays. After the exposure, the uncured portions of the photosensitive material can be developed using developing liquid, for example, to form an intaglio pattern in the mold board 14 that corresponds with the circuit pattern.

In this particular embodiment, a photosensitive film layer (for example, a dry film may be used for the photosensitive film) is used for the photosensitive material stacked on the mold board 14, which is then selectively exposed and developed, using a photomask of artwork film, etc., to form the intaglio pattern corresponding to the desired circuit pattern. It is also possible to form the photosensitive film layer by coating the mold board 14 with a liquid photosensitive material.

When the photosensitive film layer stacked on the mold board 14 is selectively exposed and developed, the uncured portions of the photosensitive film layer that have not been exposed because of the photomask may be removed from the mold board 14, while the portions of the photosensitive film layer cured because of the exposure may remain and form the intaglio pattern corresponding to the circuit pattern. The cured photosensitive film layer may thus become the resist 12. That is, a pattern corresponding to the desired circuit pattern may be formed in intaglio in the mold board 14 (FIG. 1A).

When the intaglio pattern is formed in the mold board 14, a conductive material 18 can be filled in the intaglio pattern. The conductive material 18 may be transcribed into an insulation board, in a process that will be described later, to form the circuit pattern.

The method of filling in conductive material 18 in the intaglio pattern can include any of a variety of methods known to the skilled person, such as performing plating by electroless plating and/or electroplating, filling with conductive paste, filling in conductive ink by inkjet printing, polymerizing conductive polymers, etc. The conductive material 18 filled in the intaglio pattern can include any of a variety of conductive materials apparent to the skilled person, such as aluminum (Al), silver (Ag), copper (Cu), chromium (Cr), etc.

In this particular embodiment, a metal plate is used for the mold board 14, which is used as an electrode to perform electroplating, whereby the conductive material 18 is filled in the intaglio pattern.

Figure 1B:
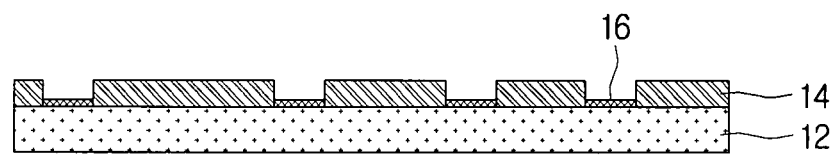
Figure 1C:
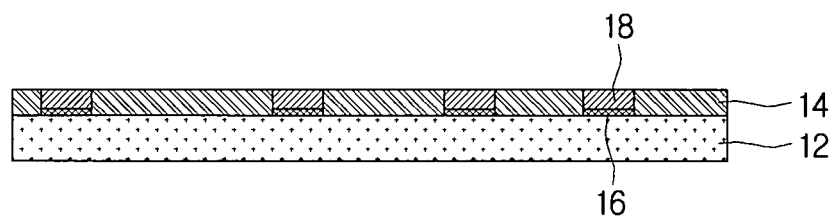
Figure 1D:
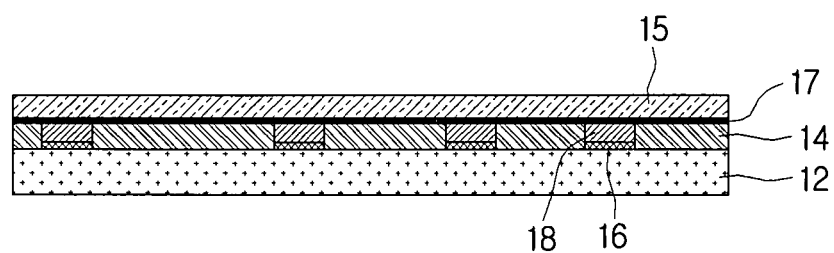

Conversely, in cases where the mold board 14 is made not of a metal plate but of resin, etc., it is possible to fill the conductive material 18 in the intaglio pattern by first performing electroless plating to form a seed layer and then using the seed layer as an electrode to perform electroplating (FIG. 1C).

Before filling in conductive material 18 in the intaglio pattern, there may be an operation further included of forming a separation film 16 in the intaglio pattern. One reason for forming the separation film 16 may be for readily separating the conductive pattern from the mold board 14 during the procedure of transferring the conductive material 18 onto the carrier 15, which will be described later in further detail. An oxide film can be used for the separation film 16, which can be formed by reacting a metal or silicon with oxygen (FIG. 1B).

When the conductive material 18 is filled in the intaglio pattern of the mold board 14, the carrier 15 can be pressed onto the mold board 14 such that the surface of the mold board 14 in which the conductive material 18 is filled in faces the carrier 15, whereby the conductive material 18 can be transferred onto the carrier 15. Transferring the conductive material 18 onto the carrier 15 finally results in the forming of a transcriptional circuit 20 on the carrier 15.

Figure 1E:
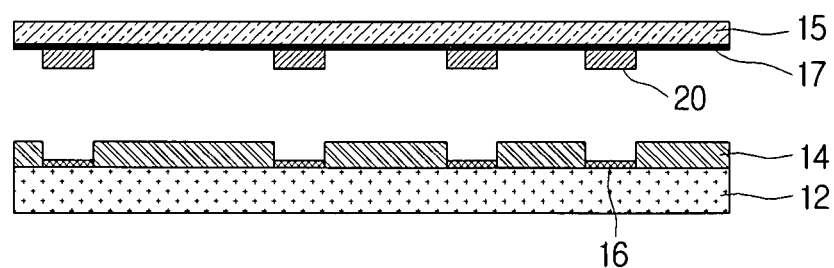

The method of transferring the conductive material 18 onto the carrier 15 can include forming an adhesion layer 17 on one surface of the carrier 15, stacking the carrier 15 onto the mold board 14 such that the surface of the carrier 15 faces the surface of the mold board 14 in which the conductive material 18 is filled in, and then pressing the carrier 15 and the mold board 14 while applying heat and pressure (FIG. 1D), after which separating the carrier 15 may result in the conductive material 18 of the mold board 14 becoming attached to the carrier 15. The conductive material 18 may thus be transferred and may form the transcriptional circuit 20 (FIG. 1E). Here, in those cases where a separation film 16 was formed beforehand in the intaglio pattern of the mold board 14, the conductive material 18 can readily be transferred to the carrier 15.

The hot pressing can advantageously be performed while applying heat inside a vacuum chamber. One reason for performing the compressing inside a vacuum chamber may be to prevent defective adhesion between the conductive pattern and the adhesion layer 17 that can occur due to a layer of air between the mold board 14 and the adhesion layer 17 of the carrier 15. The method of applying pressure can include a method of using a press, while it is also possible to apply pressure using high-pressure liquid or gases, in order to apply a uniform amount of pressure.

The adhesion layer 17 applied on the surface of the carrier 15 can be a thermoplastic adhesive. When manufacturing a circuit board by subsequently transcribing the transcriptional circuit 20 formed on the carrier 15 into an insulation board 22, using a thermoplastic adhesive can make it easier to transcribe the transcriptional circuit 20 into the insulation board 22, as a certain temperature can be applied to decrease the adhesive force of the adhesion layer 17.

When the conductive material filled in the mold board 14 is transferred onto the carrier 15, the mold board 14 in which the intaglio pattern is formed can be reused to form multiples of the same transcriptional circuit 20. In this case, it can be advantageous, for the reusing, that the mold board be made of a sturdy material. For example, a metal plate or hard resin material may be used.

Figure 2A:
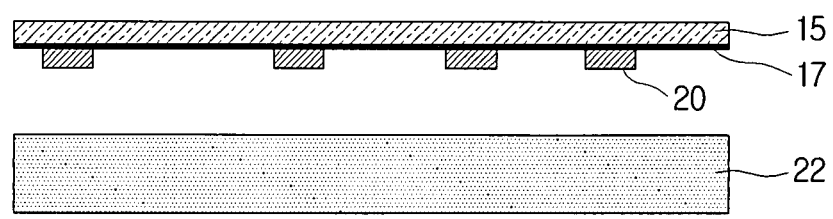
FIG. 2A, FIG. 2B, and FIG. 2C are cross-sectional views illustrating a method of manufacturing a circuit board according to an embodiment of the present invention.
Figure 2B:
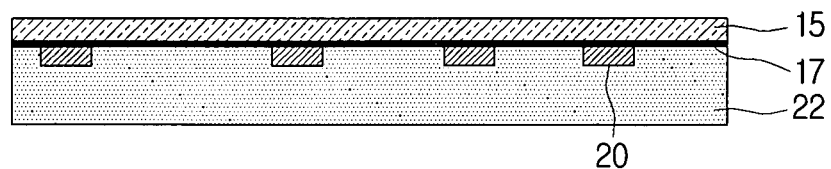
Figure 2C:
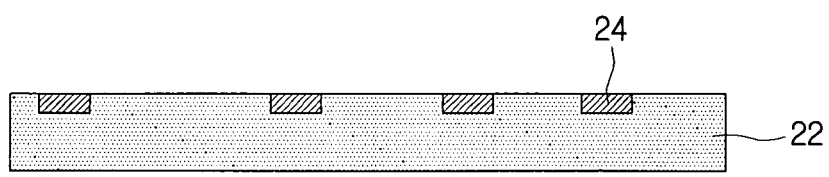

FIGS. 2A to 2C are cross-sectional views illustrating a method of manufacturing a circuit board according to an embodiment of the present invention. In FIGS. 2A to 2C are illustrated a carrier 15, an adhesion layer 17, a transcriptional circuit 20, an insulation board 22, and a circuit pattern 24.

In the method for manufacturing a circuit board according to this embodiment, the method of forming the transcriptional circuit 20 on the carrier 15 can include forming an intaglio pattern corresponding to the circuit pattern 24 by selectively forming a resist on a mold board, filling conductive material in the intaglio pattern, and afterwards pressing the carrier 15, such that the carrier faces the surface of the mold board having the conductive material filled in, to transfer the conductive material onto the carrier 15 and form the transcriptional circuit 20, as already described above. As the particulars of this process are the same as those described above, they will not be set forth in further detail.

When the conductive material is transferred onto the carrier 15 to form the transcriptional circuit 20, according to the method set forth above for forming the transcriptional circuit 20, the carrier 15 and the insulation board 22 can be pressed together such that the surface of the carrier 15 on which the transcriptional circuit 20 is formed faces the insulation board 22, to transcribe the transcriptional circuit 20 into the insulation board 22 and manufacture a circuit board having a buried circuit pattern 20.

The insulation board 22 can include at least one of thermoplastic resin and glass epoxy resin, and can be in a deformable state when transcribing the transcriptional circuit 20 into the insulation board 22. That is, the insulation board 22 can be made deformable by raising the temperature to above the transition temperature of the thermoplastic and/or glass epoxy resin, after which the transcriptional circuit 20 formed in relievo on the carrier 15 can be buried in the deformable insulation board 22 and the carrier 15 can be separated, so that when the insulation board 22 is cured, a circuit board can be manufactured that has the form of an insulation board 22 having a buried transcriptional circuit 20.

It is also possible to use prepreg for the insulation board 22, in which thermosetting resin is impregnated in glass fibers to provide a semi-cured state.

As illustrated in FIGS. 2A to 2C, when forming a circuit on one surface of the insulation board 22, the insulation board 22 can be stacked onto and pressed together with the carrier 15, with the surface of the insulation board 22 facing the surface of the carrier 15 on which the transcriptional circuit 20 is formed, and then the carrier 15 can be separated, which results in the transcriptional circuit 20 formed on the surface of the carrier 15 being buried and transcribed into the insulation board 22. Here, as the adhesion layer 17 at the interface between the carrier 15 and the transcriptional circuit 20 can be made of a thermoplastic adhesive, the transcriptional circuit 20 can be transcribed into the insulation board 22 easily by applying a certain temperature to decrease the adhesion of the adhesion layer 17.

Figure 3A:
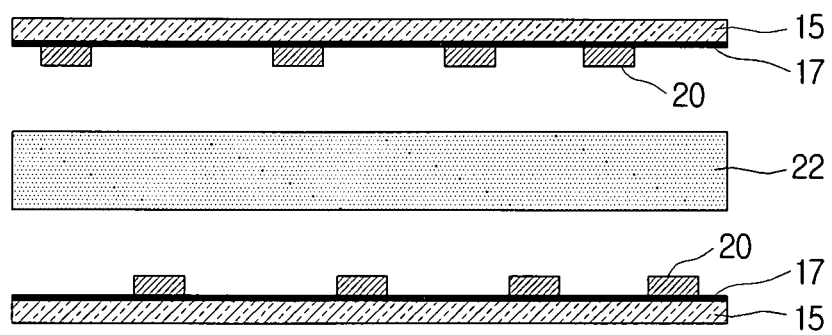
FIG. 3A and FIG. 3B are cross-sectional views illustrating a method of manufacturing a circuit board according to another embodiment of the present invention.
Figure 3B:
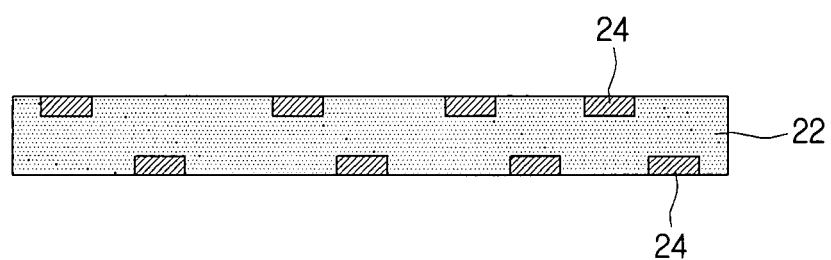

FIGS. 3A and 3B are cross-sectional views illustrating a method of manufacturing a circuit board according to another embodiment of the present invention. In FIGS. 3A and 3B are illustrated carriers 15, adhesion layers 17, transcriptional circuits 20, an insulation board 22, and circuit patterns 24.

This particular embodiment illustrates the case of forming circuits on both surfaces of the insulation board 22. The carriers 15 are manufactured with transcriptional circuits 20 formed in correspondence to the desired circuit patterns, according to the method described above for forming transcriptional circuits 20, after which the carriers 15 and insulation board 22 are pressed together with the insulation board 22 interposed between the two carriers 15, and each carrier 15 is separated, so that the transcriptional circuit 20 formed on each carrier 15 is transcribed respectively to either surface of the insulation board 22, and consequently a double-sided circuit board can be manufactured that has circuit patterns 24 buried in both sides.

Figure 4:
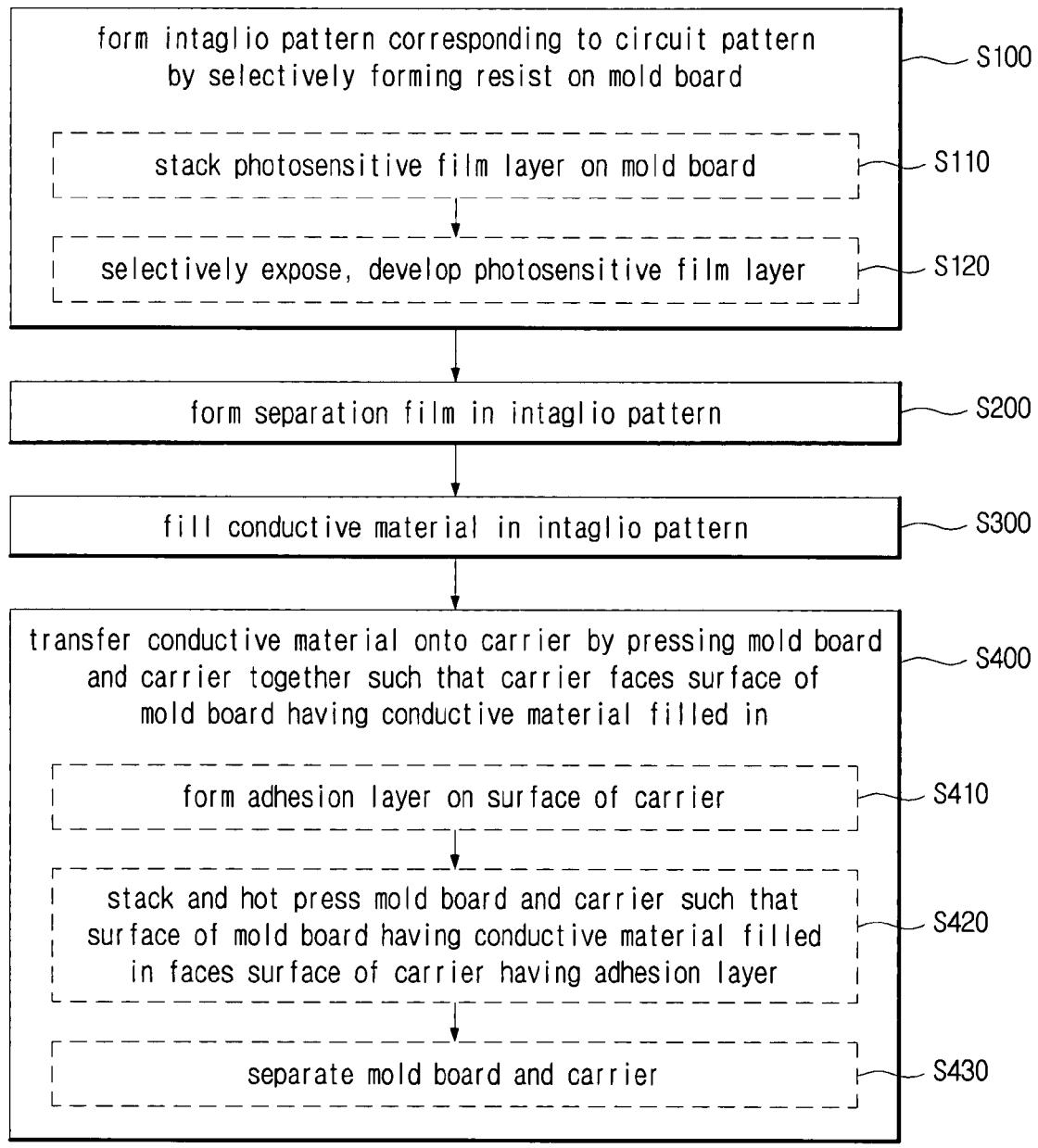
FIG. 4 is a flowchart illustrating a method of forming a transcriptional circuit according to an embodiment of the present invention.

FIG. 4 is a flowchart illustrating a method of forming a transcriptional circuit according to an embodiment of the present invention. Referring to FIG. 4, in operation S100, an intaglio pattern can be formed by selectively forming a resist on a mold board. In this particular embodiment, the method of forming the intaglio pattern can include, first, applying a photosensitive material on the mold board using existing equipment (S110), fabricating a photomask in correspondence to the circuit pattern and stacking the photomask onto the mold board to which the photosensitive material is applied, and then exposing to ultraviolet rays. After the exposure, the uncured portions of the photosensitive material can be developed using developing liquid, for example, to form an intaglio pattern in the mold board that corresponds with the circuit pattern (S120).

In operation S200, a separation film can be formed in the intaglio pattern. An oxide film can be used for the separation film, which can be formed by reacting a metal or silicon with oxygen.

In operation S300, a conductive material can be filled in the intaglio pattern. The method of filling in conductive material in the intaglio pattern can include any of a variety of methods apparent to the skilled person, such as performing plating by electroless plating and/or electroplating, filling with conductive paste, filling in conductive ink by inkjet printing, polymerizing conductive polymers, etc. The conductive material filled in the intaglio pattern can include any of a variety of conductive materials apparent to the skilled person, such as aluminum (Al), silver (Ag), copper (Cu), chromium (Cr), etc. In this particular embodiment, a metal plate can be used for the mold board, which can be used as an electrode to perform electroplating, to fill the conductive material in the intaglio pattern.

However, in cases where the mold board is made not of a metal plate but of resin, etc., it is possible to fill the conductive material in the intaglio pattern by first performing electroless plating to form a seed layer and then using the seed layer as an electrode to perform electroplating.

In operation S400, when the conductive material is filled in the intaglio pattern of the mold board, the carrier can be pressed onto the mold board such that the surface of the mold board in which the conductive material is filled in faces the carrier, whereby the conductive material can be transferred onto the carrier. Transferring the conductive material onto the carrier can result in the forming of a transcriptional circuit on the carrier.

The method of transferring the conductive material onto the carrier can include forming an adhesion layer on one surface of the carrier (S410), stacking the carrier onto the mold board such that the surface of the carrier faces the surface of the mold board in which the conductive material is filled in, and then pressing the carrier and the mold board while applying heat and pressure (S420), after which separating the carrier may result in the conductive material of the mold board becoming transferred onto the carrier to form the transcriptional circuit (S430). When the conductive material filled in the mold board is transferred onto the carrier, the mold board in which the intaglio pattern is formed can be reused to form multiples of the same transcriptional circuit.

Figure 5:
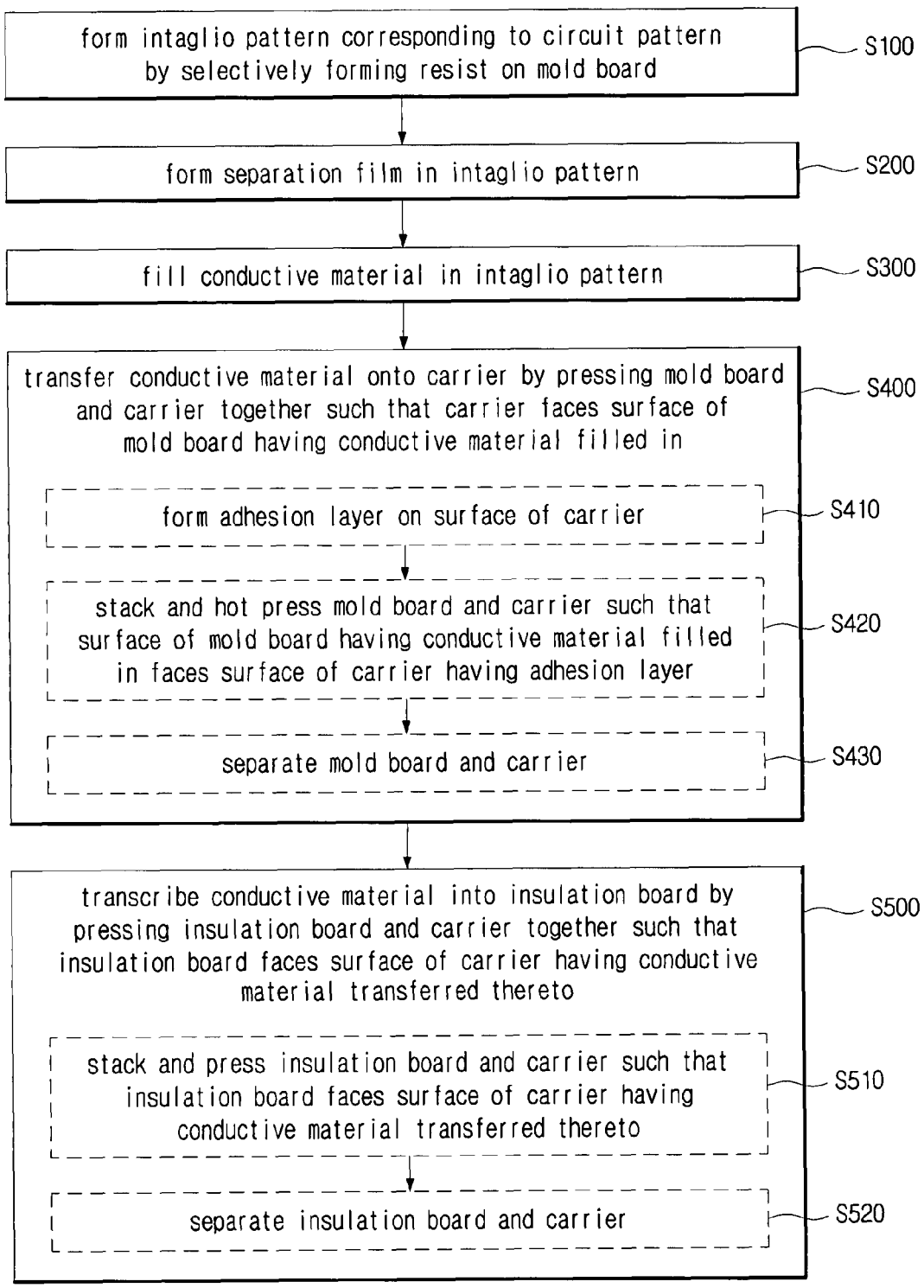
FIG. 5 is a flowchart illustrating a method of manufacturing a circuit board according to an embodiment of the present invention.

FIG. 5 is a flowchart illustrating a method of manufacturing a circuit board according to an embodiment of the present invention.

In the method for manufacturing a circuit board according to this embodiment, the method of forming the transcriptional circuit on the carrier can include forming an intaglio pattern corresponding to the circuit pattern by selectively forming a resist on a mold board, filling conductive material in the intaglio pattern, and afterwards pressing the carrier, such that the carrier faces the surface of the mold board having the conductive material filled in, to transfer the conductive material onto the carrier and form the transcriptional circuit, as already described above. As the particulars of this process are the same as those described above, they will not be set forth in further detail, and only operation S500 will be described, which is for transcribing the transcriptional circuit formed on the carrier into the insulation board.

In operation S500, when the conductive material is transferred onto the carrier to form the transcriptional circuit, according to the method set forth above for forming the transcriptional circuit, the carrier and the insulation board can be pressed together such that the surface of the carrier on which the transcriptional circuit is formed faces the insulation board, to transcribe the transcriptional circuit into the insulation board and manufacture a circuit board having a buried circuit pattern.

When forming a circuit on one surface of the insulation board, the insulation board can be stacked onto and pressed together with the carrier, with the surface of the insulation board facing the surface of the carrier on which the transcriptional circuit is formed (S510), and then the carrier can be separated, which results in the transcriptional circuit formed on the surface of the carrier being transcribed and buried into the insulation board (S520). Here, as the adhesion layer at the interface between the carrier and the transcriptional circuit can be made of a thermoplastic adhesive, the transcriptional circuit can be transcribed into the insulation board easily by applying a certain temperature to decrease the adhesion of the adhesion layer.

According to certain embodiments of the invention as set forth above, transcriptional circuits can be formed which can be transcribed into an insulation board using existing equipment, so that costs can be reduced.

Also, a circuit board can be manufactured in which transcriptional circuits can be transcribed into an insulation board to form circuit patterns to a high density. A circuit board thus manufactured has circuits formed inside the board, so that there is greater adhesion between the circuits and the board and hence less likelihood of peeling of the circuits, and the overall thickness of the board can be reduced.

In addition, as the circuits are formed inside the board, there is a greater degree of flatness and easier heat release. Moreover, there are fewer occurrences of warpage on the board, and there is greater reliability with regards ion migration between adjacent circuit lines.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a circuit board, the method comprising:
    forming an intaglio pattern corresponding to a circuit pattern by selectively forming a resist on a mold board;
    filling conductive material in the intaglio pattern;
    transferring the conductive material onto a carrier by pressing the carrier onto the mold board such that one surface of the carrier faces the surface of the mold board having the conductive material filled in, an adhesive layer which comprises thermoplastic adhesive being formed on the one surface of the carrier;
    transcribing the conductive material into an insulation board by pressing the insulation board onto the carrier such that the insulation board faces and contacts the surface of the carrier having the conductive material transferred thereto, the conductive material being buried in the insulation board and the adhesive force of the adhesive layer to the conductive material being decreased by hot-pressing the insulation board onto the carrier; and
    separating the carrier along with the adhesive layer from the insulation layer.

2. The method of claim 1, further comprising, before filling in the conductive material:
    forming a separation film in the intaglio pattern.

3. The method of claim 1, wherein transferring the conductive material comprises:
    separating the mold board and the carrier.

4. The method of claim 1, wherein the insulation board comprises at least one of thermoplastic resin and glass epoxy resin, and the insulation board is in a deformable state during the transcribing of the conductive material.

5. The method of claim 1, wherein the forming the intaglio pattern comprises:
    stacking a photosensitive film layer on the mold board; and
    selectively exposing and developing the photosensitive film layer.

6. The method of claim 1, wherein the mold board is a metal plate, and filling in the conductive material is performed by electroplating.

7. The method of claim 1, wherein the filling in of the conductive material and the transferring of the conductive material are repeatedly performed after transferring the conductive material.

* * * * *